(12) United States Patent
Kishida

(10) Patent No.: US 6,888,852 B1
(45) Date of Patent: May 3, 2005

(54) SIGNAL COMBINING CIRCUIT HAVING TWO A/D CONVERTERS

(75) Inventor: Masaya Kishida, Tokyo (JP)

(73) Assignee: Koninklijke Philips Electronics N.V., Eindhoven (NL)

( * ) Notice: Subject to any disclaimer, the term of this patent is extended or adjusted under 35 U.S.C. 154(b) by 1097 days.

(21) Appl. No.: 09/640,733

(22) Filed: Aug. 17, 2000

(30) Foreign Application Priority Data

Aug. 27, 1999 (JP) .......................................... 11-240893

(51) Int. Cl.[7] .............................................. H03M 1/10
(52) U.S. Cl. ..................................................... 370/537
(58) Field of Search .......................... 341/155; 370/419, 370/498, 537

(56) References Cited

U.S. PATENT DOCUMENTS 6,172,635 B1 * 1/2001 Nakamura et al. .......... 341/155

* cited by examiner

*Primary Examiner*—Chi Pham
*Assistant Examiner*—Derrick W. Ferris
(74) *Attorney, Agent, or Firm*—Michael J. Ure

(57) ABSTRACT

To provide a digital signal combining circuit having a function to combine two digital signals converted from two analog signals and a function to compensate for nonlinearity of two A/D converters upon input of one analog input signal and to convert the analog input signal to a digital signal with S/N ratio improved by about 3 dB.

The digital signal combining circuit has a first inversion circuit (3), a second inversion circuit (4), an A/D converter (ADC1), a third inversion circuit (6), a fourth inversion circuit (7), another A/D converter (ADC2), a digital inversion circuit (11) and a digital mixer circuit (10). When only one analog input signal is converted to a digital output signal, the analog input signal is inputted into a positive input of the A/D converter (ADC1), an inverted analog input signal is inputted into a negative input of the A/D converter (ADC1), the inverted analog input signal is inputted into a positive input of the other A/D converter (ADC2), the analog input signal is inputted into a negative input of the other A/D converter (ADC2), and the digital inversion circuit (11) inverts a digital output from the other A/D converter (ADC2).

1 Claim, 2 Drawing Sheets

SIGNAL COMBINING CIRCUIT HAVING TWO A/D CONVERTERS

BACKGROUND OF THE INVENTION

The present invention relates to a signal combining circuit having the first inversion circuit that inverts an analog input signal, the second inversion circuit that inverts the analog signal inverted by the first inversion circuit, an A/D converter that inputs output signals from the first and second inversion circuits and converts the signals to digital signals, the third inversion circuit that inverts another analog input signal, the fourth inversion circuit that inverts the other analog input signal inverted by the third inversion circuit, another A/D converter that inputs output signals from the third and fourth inversion circuits and converts the signals to other digital signals, and a digital mixer circuit that combines the digital output signals from the A/D converter and the other digital output signals from the other A/D converter.

To convert two analog signals, e.g., a synchronization signal and a video signal to digital signals, respectively, and then to combine the digital signals, there has been conventionally employed a signal combining circuit having two A/D converters and a digital mixer circuit as described in the introduction part. FIG. 2 is a circuit block diagram of a conventional signal combining circuit having two A/D converters and a digital mixer. An analog input signal from an input terminal 1 is inverted by the first inversion circuit 3 and inputted into the negative input of an A/D converter ADC1. The inverted input signal is further inverted by the second inversion circuit 4 and inputted into the positive input of the A/D converter ADC1. The A/D converter ADC1 converts these difference input signals to digital signals. After the magnitudes of the signals converted into digital signals are adjusted by a digital volume 8, the digital signals are inputted into a digital mixer circuit 10. Likewise, another analog input signal from an input terminal 2 is converted to other digital signals by the third and fourth inversion circuits 6, 7 and another A/D converter ADC2, the magnitudes of the signals are adjusted by a digital volume 9 and then the digital signals are inputted into the digital mixer circuit 10. The digital mixer circuit 10 combines these two digital input signals to thereby output one digital signal.

The digital combining signal circuit having these two A/D converters can be also utilized when one analog input signal is converted to one digital signal. In that case, one of the A/D converters may be used to convert the analog signal to the digital signal and the input of the other A/D converter may be set at 0V.

Meanwhile, it is ideal that these A/D converters have linearity, i.e., the level of a digital output signal is proportional to that of an analog input signal. However, there are cases where an actual A/D converter has nonlinearity. For example, if an analog signal of 1V is inputted into an A/D converter, an output signal from the A/D converter should be a digital output signal corresponding to original level of 1V, but a digital output signal corresponding to 0.8V level is sometimes outputted. If the A/D converters are the same in type or these A/D converters are included in one IC, they tend to have same nonlinearity.

The inventor of the present invention contrived a digital signal combining circuit which employs two A/D converters to convert one analog signal to one digital signal and compensates for the distortion of the output signal due to the nonlinearity of these two A/D converters. Further, it was discovered that this circuit can obtain an effect of improving S/N ratio.

SUMMARY OF THE INVENTION

It is an object of the present invention to provide A/D converters having a function to combine two digital signals converted from two analog signals into one digital signal and a function to compensate for the distortion of an output signal due to the nonlinearity of two A/D converters upon input of one analog input signal and to convert the analog input signal to a digital signal with S/N ratio improved by about 3 dB.

To obtain this object, a preferred embodiment of the present invention is characterized in that the A/D converter and the other A/D converter respectively have a positive input and a negative input, the signal combining circuit further comprises a digital inversion circuit to be connected to the other A/D converter; when the A/D converter and the other A/D converter convert only the analog input signal to the digital output signal, the analog input signal is inputted into the positive input of the A/D converter via at least one of the first to fourth inversion circuits, the inverted analog input signal is inputted into the negative input of the A/D converter via at least one of the first to fourth inversion circuits, the inverted analog input signal is inputted into the positive input of the other A/D converter via at least one of the first to fourth inversion circuits, and the analog input signal is inputted into the negative input of the other A/D converter via at least one of the first to fourth inversion circuits; and further in that the digital inversion circuit inverts the digital output from the other A/D converter.

An analog input signal and the inverted analog input signal are inputted into the positive input and the negative input of the A/D converter, respectively. The analog input signals are converted to digital output signals nonlinearly by the nonlinearity of the A/D converter of difference input type. For example, an analog input signal of 1V is converted to a digital output signal corresponding to 0.8V output level. On the other hand, the inverted analog input signal is inputted into the positive input of the other A/D converter and the analog input signal is inputted into the negative input thereof. Due to this, the analog input signals are converted to digital output signals by almost the same nonlinearity as that of the A/D converter, and an inverted digital output signal having a property that the nonlinearity is inverted by the digital inversion circuit, is outputted. For example, in case of an analog input signal of 1V, a digital output signal corresponding to 1.2V output level is outputted from the digital inversion circuit. The digital mixer circuit combines the output signals from the two A/D converters and the nonlinearity of the two A/D converters is, therefore, cancelled. Furthermore, since the one analog input signal is converted to digital signals by the two A/D converters and then the signals are superimposed, random noise is reduced by about 3 dB.

BRIEF DESCRIPTION OF THE DRAWING

The embodiment of the present invention will be described hereinafter, with reference to the Drawing, in which.

DESCRIPTION OF THE PREFERRED EMBODIMENTS

Figure 1:
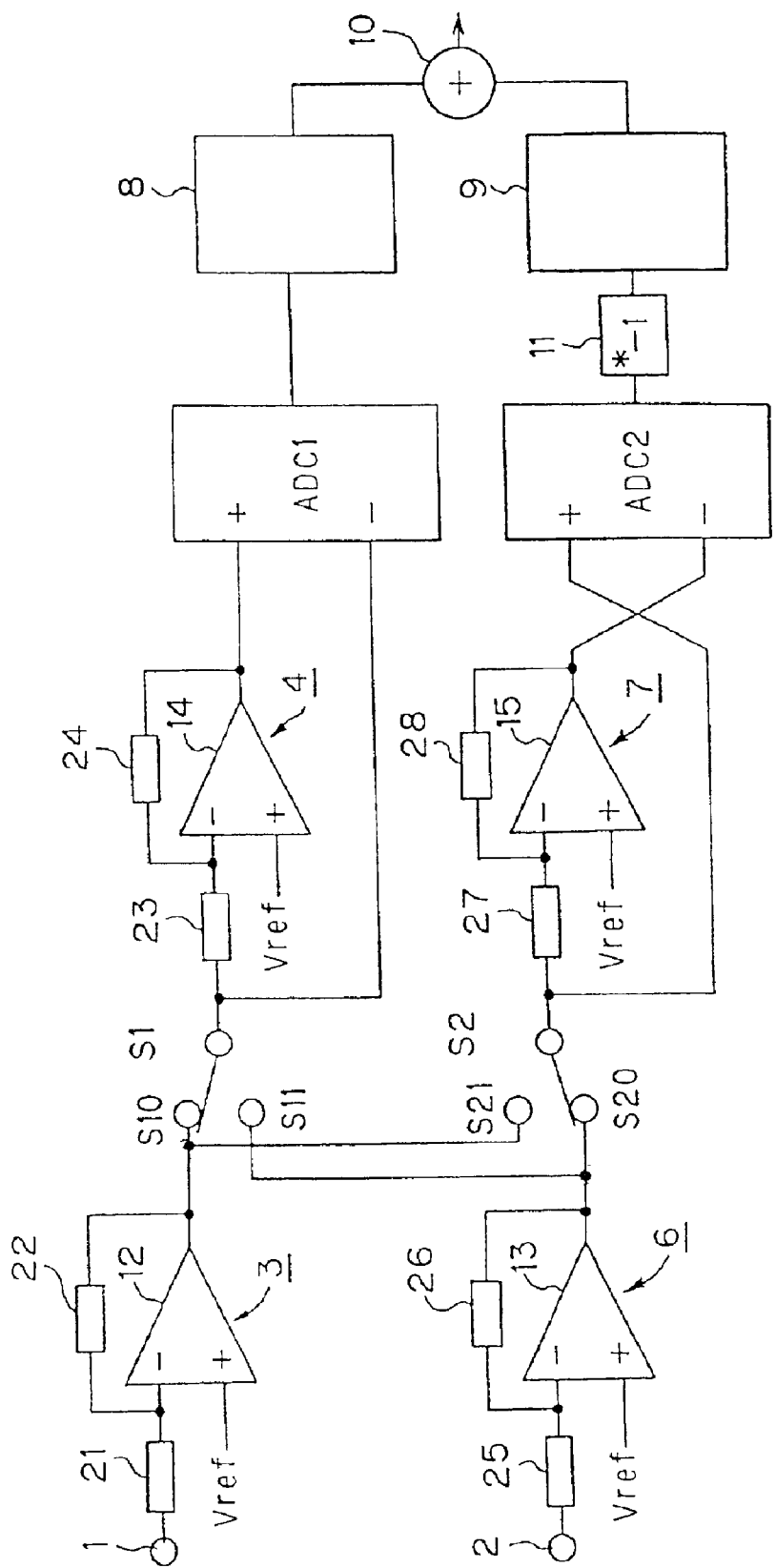
FIG. 1 is a circuit block diagram showing a digital signal combining circuit in one embodiment of the present invention.
Figure 2:
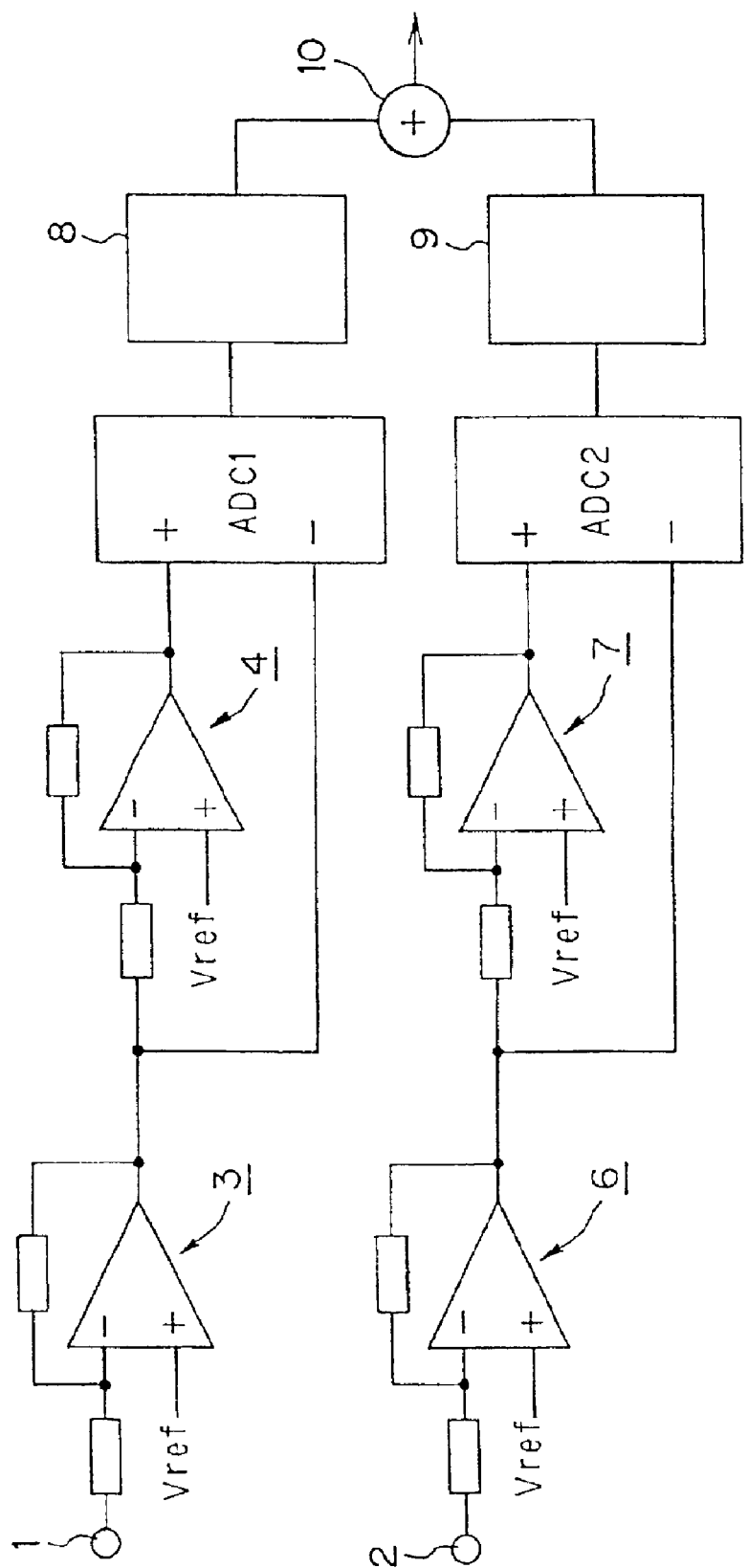
FIG. 2 is a block diagram showing a conventional digital signal combining circuit.

A inversion circuit 3 has resistors 21, 22 and an amplifier 12. The amplifier 12 has a non-inversion input terminal applied with a reference voltage Vref, an inversion input terminal coupled to an input terminal applied with an analog input signal via the resistor and to the output terminal of the amplifier 12 via the resistor 22, and the output terminal coupled to the inversion input terminal via the resistor 22 and connected to one inputs S10 and S21 of switches S1 and S2, respectively. The output terminal of the amplifier 12 is also the output terminal of the inversion circuit 3. The other input S11 of the switch S1 is coupled to the output terminal of an amplifier 13, and the output of the switch S1 is coupled to the inversion input terminal of an inversion circuit 4 via a resistor 23 and further connected to the negative input of an A/D converter ADC1. The inversion circuit 4 has resistors 23, 24 and an amplifier 14. The amplifier 14 has a non-inversion input terminal applied with a reference voltage Vref, an inversion input terminal coupled to the output of the switch 1 via the resistor 23 and to the output terminal of the amplifier 14 via the resistor 24, and the output terminal coupled to the inversion input terminal via the resistor 24 and connected to the positive input of the A/D converter ADC1. The output of the A/D converter ADC1 is coupled to a digital mixer circuit 10 via a digital volume 8.

An inversion circuit 6 has resistors 25, 26 and an amplifier 13. The amplifier 13 has a non-inversion input terminal applied with a reference voltage Vref, an inversion input terminal coupled to a terminal 2 applied with another analog input signal via the resistor 25 and the output terminal of the inversion circuit via the resistor 26, and the output terminal coupled to the inversion input terminal via the resistor 26 and connected to one inputs S11 and S20 of the switches S1 and S2, respectively. The output terminal of the amplifier 13 is also the output terminal of the inversion circuit 6. The other input S21 of the switch S2 is connected to the output terminal of the amplifier 12, and the output of the switch S2 is coupled to the inversion input terminal of an amplifier 15 via a resistor 27 and connected to the positive input of an A/D converter ADC2. An inversion circuit 7 has resistors 27, 28 and the amplifier 15. The amplifier 15 has a non-inversion input terminal applied with a reference voltage Vref, an inversion input terminal coupled to the output of the switch S2 via the resistor 27 and to the output terminal of the amplifier 15 via the resistor 28, and the output terminal coupled to the inversion input terminal via the resistor 28 and connected to the negative input of the A/D converter ADC 2. The output terminal of the A/D converter ADC2 is coupled to the digital mixer circuit 10 via a digital inversion circuit 11 and a digital volume 9.

The output terminal of the switch S1 is coupled to one of the inputs S10 and S11 according to a control signal CTR1 (not shown). When the control signal CTR1 is at high level, the output terminal of the switch S1 is coupled to the input S11. When the control signal CTR1 is at low level, the output terminal of the switch S1 is coupled to the input S10. Likewise, the output terminal of the switch S2 is coupled to one of the inputs S20 and S21 according to a control signal CTR2 (not shown). When the control signal CTR2 is at high level, the output terminal of the switch S2 is coupled to the input S21. When the control signal CTR2 is at low level, the output terminal of the switch S2 is coupled to the input S20.

Next, the operation of this circuit will be described. The circuit operation in case of converting one analog signal to a digital signal is as follows. In this case, the control signal CTR1 for the switch S1 is at low level, whereas the control signal CTR2 for the switch S2 is at high level. Needless to say, as is obvious from the following description to the operation, even if the control signal CTR1 for the switch S1 is at high level and the control signal CTR2 for the switch S2 is at low level, the same advantage can be obtained.

An analog input signal is inputted into the input terminal 1 and inverted by the inversion circuit 3. The inverted analog signal is inputted into the negative input of the A/D converter ADC1 via the switch S1. The inverted analog signal is further inverted by the inversion circuit 4 and inputted into the positive input of the A/D converter ADC 1. The A/D converter ADC1 converts the difference input signals to digital signals. After the magnitudes of the signals converted into the digital signals are adjusted by the digital volume 8, the digital signals are inputted into the digital mixer 10. Furthermore, the inverted input signal, which is an output signal from the inversion circuit 3, is inputted into the positive input of the A/D converter ADC2 via the switch S2. The inverted analog input signal is further inverted by the inversion circuit 7 and inputted into the negative input of the A/D converter ADC2. The A/D converter ADC2 converts the difference input signals to digital signals. After the signals converted to the digital signals are inverted by the digital inversion circuit 11 and the magnitudes of the digital signals are adjusted by the digital volume 9, the digital signals are inputted into the digital mixer circuit 10. Since the digital signals from the digital volume 9 and those from the digital volume 8 inputted into the digital mixer circuit 10 are the same, the same signals are added together to thereby reduce random noise by about 3 dB. At this moment, to normalize an output signal from the digital mixer circuit 10, the magnitudes of the output signals from the digital volumes 8 and 9 may be half as those of ordinary output signals when the control signals CTR1 and CTR2 are at low level and at high level, respectively. In addition, the analog input signal is converted to a digital output signal by the A/D converter ADC2 by almost the same nonlinearity as that of the A/D converter ADC1, and an inverted digital output signal having a property that the nonlinearity is inverted by the digital inversion circuit 11, is outputted. The digital mixer circuit 10 combines the output signals from these two A/D converters ADC1 and ADC2, so that the nonlinearity of each of the two A/D converters is cancelled.

The circuit operation in case of converting two analog input signals to two digital signals and then combining the two digital signals is as follows. In this case, the control signal CTR1 for the switch S1 is at low level and the control signal CTR2 for the switch S2 is at low level, as well. Needless to say, as is obvious from the following description to the operation, even if the control signal CTR1 for the switch S1 is at high level and the control signal CTR2 for the switch S2 is at high level, the same advantage can be obtained.

An analog input signal is inputted into the input terminal 1 and inverted by the inversion circuit 3. The inverted analog input signal is inputted into the negative input of the A/D converter ADC1 via the switch S1. The inverted analog input signal is further inverted by the inversion circuit 4 and inputted into the positive input of the A/D converter ADC1. The A/D converter ADC1 converts the difference input signals to digital signals. After the magnitudes of the signals converted to the digital signals are adjusted by the digital volume 8, the digital signals are inputted into the digital mixer circuit 10.

Another analog input signal is inputted into the input terminal 2 and inverted by the inversion circuit 6. The inverted other analog input signal is inputted into the positive input of the A/D converter ADC2 via the switch S2. The inverted other analog input signal is further inverted by the inversion circuit 7 and inputted into the negative input of the A/D converter ADC2. The A/D converter ADC2 converts the difference input signal to other digital signals. After the signals converted to the other digital signal are inverted by the digital inversion circuit 11 and the magnitudes thereof are adjusted by the digital volume 9, the digital signals are inputted into the digital mixer circuit 10. The digital mixer circuit combines the digital signals from the digital volume 8 and the other digital signals from the digital volume 9, into a digital combined output signal.

As stated so far, the signal combining circuit according to the present invention has a function to combine two digital signals converted from two analog signals and a function to compensate for the nonlinearity of the two A/D converters upon input of one analog input signal and to convert the analog input signal to a digital signal with S/N ratio improved by about 3 dB.

DESCRIPTION OF REFERENCE NUMERALS

1, 2 input terminal
3, 4, 6, 7 inversion circuit
8, 9 digital volume
10 digital mixer circuit
11 digital inversion circuit
12, 13, 14, 15 amplifier
21–28 resistor

What is claimed is:

1. A signal combining circuit comprising:
a first inversion circuit that inverts an analog input signal; a second inversion circuit that inverts the analog input signal inverted by said first inversion circuit; an A/D converter that inputs output signals from said first and second inversion circuits and converts the signals into digital output signals; a third inversion circuit that inverts another analog input signal; a fourth inversion circuit that inverts the other analog input signal inverted by said third inversion circuit; another A/D converter that inputs output signals from said third and fourth inversion circuits and converts the signals into other digital output signals; and a digital mixer circuit that combines said digital output signals from said A/D converter and said other digital output signals from said other A/D converter, wherein said A/D converter and said other A/D converter respectively have a positive input and a negative input, and wherein said signal combining circuit further comprises a digital inversion circuit to be connected to said other A/D converter, further wherein when said A/D converter and said other A/D converter convert only said analog input signal into the digital output signal, said analog input signal is inputted into said positive input of said A/D converter via at least one of said first to fourth inversion circuits, said inverted analog input signal is inputted into said negative input of said A/D converter via at least one of said first to fourth inversion circuits, said inverted analog input signal is inputted into said positive input of said other A/D converter via at least one of said first to fourth inversion circuits, and said analog input signal is inputted into said negative input of said other A/D converter via at least one of said first to fourth inversion circuits, further wherein said digital inversion circuit inverts the digital output from said other A/D converter.

* * * * *